United States Patent [19]

Tobin et al.

[11] Patent Number: 4,914,046

[45] Date of Patent: Apr. 3, 1990

[54] POLYCRYSTALLINE SILICON DEVICE ELECTRODE AND METHOD

[75] Inventors: Philip J. Tobin; Bich Y. Nguyen; Fabio Pintchovski, all of Austin, Tex.

[73] Assignee: Motorola, Inc., Schaumburg, Ill.

[21] Appl. No.: 305,590

[22] Filed: Feb. 3, 1989

[51] Int. Cl.$^4$ .................. H01L 21/265; H01L 21/283
[52] U.S. Cl. ........................................ 437/24; 437/46; 437/950
[58] Field of Search .................. 437/24, 29, 40, 41, 437/46, 950; 148/DIG. 144

[56] References Cited

U.S. PATENT DOCUMENTS

| | | | |
|---|---|---|---|
| 4,143,178 | 3/1979 | Harada et al. | 427/85 |
| 4,682,407 | 7/1987 | Wilson et al. | 437/25 |
| 4,683,637 | 8/1987 | Varker et al. | 437/63 |
| 4,740,481 | 4/1988 | Wilson et al. | 437/24 |
| 4,774,197 | 9/1988 | Haddad et al. | 437/27 |
| 4,808,555 | 2/1989 | Mauntel et al. | 437/191 |

FOREIGN PATENT DOCUMENTS 58-186971 11/1983 Japan ..................................... 437/46

OTHER PUBLICATIONS

Ghandhi, VLSI Fabrication Principles, John Wiley & Sons, N.Y., 1981, pp. 432-439.

Primary Examiner—Olik Chaudhuri
Attorney, Agent, or Firm—John A. Fisher

[57] ABSTRACT

A polycrystalline silicon electrode and method for its fabrication are disclosed. The electrode includes a barrier layer formed by the implantation of carbon, nitrogen, or oxygen ions between two layers of polycrystalline silicon. The lower layer of polycrystalline silicon is lightly doped or undoped and the top layer is heavily doped to increase the conductivity of the electrode. The barrier layer impedes the diffusion of conductivity determining dopant impurities from one layer of polycrystalline silicon to the other.

7 Claims, 2 Drawing Sheets

POLYCRYSTALLINE SILICON DEVICE ELECTRODE AND METHOD

BACKGROUND OF THE INVENTION

This invention relates generally to semiconductor devices and their production, and more specifically to semiconductor devices with polycrystalline silicon electrodes and to a method for their fabrication.

Many semiconductor devices utilize doped polycrystalline silicon as an electrode. For example, in an insulated gate field effect transistor a doped polycrystalline silicon gate electrode is formed overlying a thin gate insulator. The polycrysalline silicon is heavily doped with conductivity determining impurities to increase the conductivity of the gate electrode. These conductivity determining impurities can seriously effect the integrity of the underlying gate insulator, especially in devices in which the gate insulator is only a few tens of nanometers in thickness.

The proper operation of the device requires a high conductivity electrode, but the dopant impurities used to achieve the high conductivity must be kept from diffusing into and through the underlying insulator to avoid shifts in threshold voltage and/or degradation of reliability of the gate insulator. This problem is espcially acute in the case of boron doping in the presence of a hydrogen containing ambient. Polycrystalline silicon, as it is usually deposited, is characterized by grain boundaries between individual columnar polycrystalline grains. These grain boundaries provide an easy path for the diffusing of dopant impurities because diffusion through the grain boundaries is much more rapid than through the silicon itself at typical processing temperatures. The problem of maintaining insulator integrity while achieving a high dopant concentration and high conductivity in the polycrystalline silicon is thus made worse by the enhanced diffusion of impurities along grain boundaries.

One solution which has been used to mitigate the degradation of the thin dielectric caused by segregation of dopant impurities at the polycrystalline silicon-insulator interface or in the insulator itself, has been to include a buried titanium nitride layer between two separate layers of polycrystalline silicon during fabrication of the gate electrode. Although this technique is effective for mitigating the degradation, it is an expensive solution which requires additional and costly processing steps.

Accordingly, a need existed for an improved method and structure for simultaneously achieving high conductivity of the polycrystalline silicon electrode and high reliability of the underlying insulator.

It is therefore an object of this invention to provide an improved semiconductor device.

It is a further object of this invention to provide an improved polycrystalline silicon electrode incorporating a barrier to dopant diffusion.

It is still a further object of this invention to provide an improved process for the fabrication of polycrystalline silicont electrodes and semiconductor devices.

BRIEF SUMMARY OF THE INVENTION

The foregoing and other objects and advantges of the invention are achieved with a structure and method for its fabrication in which a barrier or gettering layer is formed within a polycrystalline silicon electrode. The barrier layer in accordance with the invention impedes the diffusion of dopant impurities through the polycrystalline silicon material, and especially along the grain boundries, but does not substantially reduce the conductivity of the electrode. In accordance with one embodiment of the invention, a first layer of polycrystalline silicon material is deposited on an insulating layer which overlies a semiconductor substrate. The top surface of this polycrystalline silicon layer is implanted with ions such as carbon, nitrogen, or oxygen which will aggregate at the grain boundaries inthe polycrystalline silicon material during subsequent thermal steps and impede the diffusion of dopant impurities along these grain boundaries. A second layer of polycrystalline silicon is then deposited over the first layer to form the total necessary thickness of the polycrystalline silicon electrode. The implantation dose of the barrier forming material is selected to impede the unwanted diffusion without severly effecting the conductivity of the polycrystalline silicon material. The first layer of polycrystalline silicon is preferably deposited as either an undoped or lightly doped layer and the second layer is heavily doped with a conductivity determining dopant impurity such as boron or phosphorus by in situ doped deposition, ion implantation, or gas phase post deposition doping.

BRIEF DESCRIPTION OF THE DRAWINGS

FIG. 1b graphically illustrates the distribution of phosphorus dopant in the polycrystalline silicon electrode of FIG. 1a;

DETAILED DESCRIPTION OF PREFERRED EMBODIMENTS

Figure 1A:
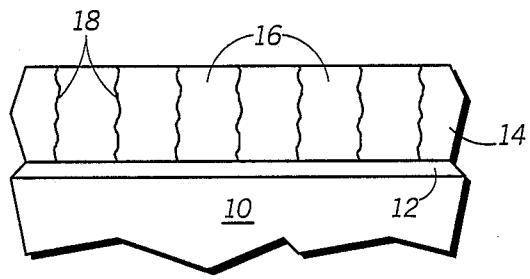
FIG. 1a schematically illustrates, in cross-section, a portion of a semiconductor device and the difficulties encountered with a polycrystalline silicon electrode thereof.

FIG. 1 illustrates difficulties encountered with prior art polycrystalline silicon electrode structures. Illustrated schematically, in cross-section, is a portion of a device having a polycrystalline silicon electrode, such as a gate electrode. The device includes a semiconductor substrate 10, over which is formed a gate insulator 12. A polycrystalline silicon electrode layer 14 is formed overlying the gate insulator. Typically subtrate 10 is monocrystalline silicon, gate insulator 12 is silicon dioxide and polycrystalline silicon electrode 14 is deposited by chemical vapor deposition. The polycrystalline silicon electrode is either deposited as doped polycrystalline silicon (in situ doped) or is deposited undoped and subsequently doped with an impurity dopant such as phosphorus or boron by ion implantation or a thermal diffusion process. Polycrystalline silicon, by its very nature, is made up of a plurality of small crystals or grains of silicon material 16 which are joined along grain boundaries 18. The size, shape, and exact nature of the grains and grain boundaries are functions of the deposition conditions, the nature of the surface upon which the polycrystalline silicon is deposited, and the like. It is well known that dopant impurities such as phosphorus and boron diffuse much more rapidly along the grain boundaries than they do through the silicon itself.

Figure 1B:
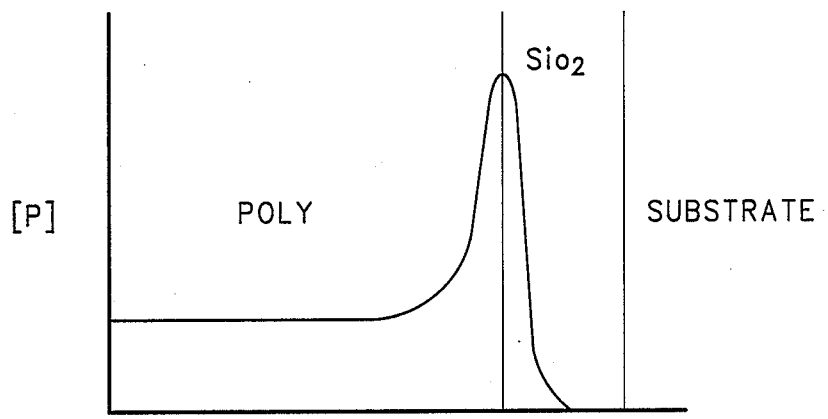

FIG. 1b illustrates graphically, for a phosphorus doped polycrystalline silicon electrode, the distribution of phosphorus in the structure after a thermal redistribution cycle. A similar distribution would be found for electrodes doped with other dopant impurities. The figure illustrates that in the polycrystalline silicon the doping is relatively constant from the outer surface through the bulk of the material and then increases near the polycrystalline silicon-insulator surface. The dopant level is also high in the insulator at its interface with the polycrystalline silicon and tapers off with distance through the insulator. As a worst case, the concentration of phosphorus within the insulator is so great that some portion of the phosphorus may even extend through the insulator to the underlying substrate. A high concentration of phosphorus within the insulator is undesirable from the standpoint of reliability and predictability and the penetration of phosphorus through the insulator and into the substrate is totally unacceptable.

Figure 2:
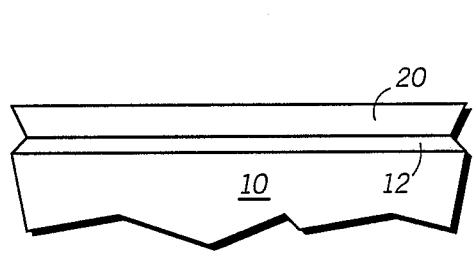
FIGS. 2–4 illustrates, in cross-section, a semiconductor device fabricated in accordance with the process of the invention.
Figure 3:
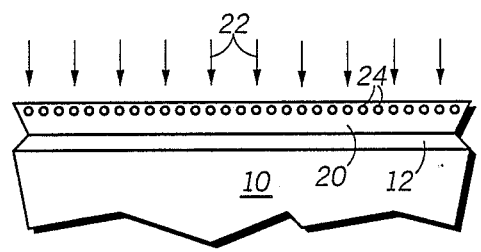
Figure 4:
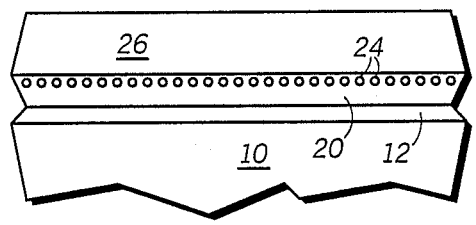

FIGS. 2–4 illustrate the process steps in accordance with one embodiment of the invention which prevents the undesirable distribution of dopant impurities in the polycrystalline silicon electrode and insulator system as illustrated in FIG. 1b. As illustrated in FIG. 2, the process starts, as before, with a semiconductor substrate 10 upon which is formed an insulating layer 12. In a preferred embodiment of the invention substrate 10 is monocrystalline silicon and insulator 12 is a thin layer of gate oxide formed by the thermal oxidation of the silicon substrate. In the preferred embodiment gate insulator 12 has a thickness of about 10–20 nanometers. Overlying insulator 12 is deposited a first polycrystalline silicon layer 20 which is either undoped or is lightly doped with conductivity determining impurities. Polycrystalline silicon layer 20 preferably has a thickness of about 50 nanometers.

In accordance with the invention, a gettering or barrier layer is formed within the polycrystalline silicon grain boundaries by the implantation of ions of carbon, nitrogen, or oxygen. The implantation is illustrated in FIG. 3 by the arrows 22 and the resultant location of the implanted ions is illustrated by the circles 24. It is the intent of the invention to form a barrier layer within the grain boundaries which is located in the interior of the polycrystalline silicon electrode. This is accomplished by implanting the barrier forming impurity at a low energy so that the impurity is positioned near the surface of layer 20 and aggregating the implanted impurity within the grain boundaries. The barrier forming material is implanted, for example, at an energy of about 15 KeV to a dose of about $1\times10^{14}$–$2\times10^{16}$ and preferably to a dose of about $5\times10^{15}$–$2\times10^{16}$ cm$^{-2}$. The aggregation of the impurity at the grain boundaries may be enhanced by a thermal anneal such as an anneal at 800° C. for 15 minutes.

The process then continues, in accordance with the invention, by the deposition of a second layer of polycrystalline silicon 26 as illustrated in FIG. 4. The second layer of polycrystalline silicon overlies the first layer 20 with the implanted carbon, nitrogen, or oxygen at or near the surface thereof. The second layer of polycrystalline silicon is heavily doped with a conductivity determining impurity dopant such as phosphorus or boron so that the composite polycrystalline silicon electrode made up of layers 20 and 26 is of high conductivity. The thickness of layer 26 is determined so that the composite electrode structure, layers 20 and 26 together, has the required thickness. Preferably, polycrystalline silicon layer 26 has a thickness of about 250 nanometers.

Figure 5:
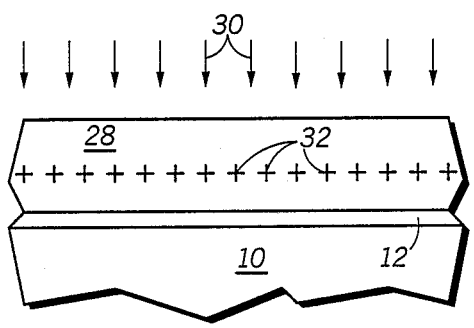
FIG. 5 illustrates, in cross-section, a further embodiment of the invention.

FIG. 5 illustrates an alternate embodiment of the process in accordance with the invention. In accordance with this embodiment, as before, a semiconductor substrate 10 is provided having a insulator layer 12 formed on a surface thereof. A polycrystalline silicon layer 28 is deposited overlying insulator layer 12. As illustrated by arrows 30, polycrystalline silicon layer 28 is ion implanted with ions of carbon, nitrogen, or oxygen at a sufficient energy so that those ions are implanted deep within layer 28 as illustrated by the plus signs 32. The presence of the barrier forming implanted ions at a location within layer 28 effectively divides layer 28 into two layers, one located beneath the barrier layer and closer to the semiconductor substrate, and a second layer above the barrier layer and located further away from the semiconductor substrate. Polycrystalline silicon layer 28 is preferably deposited undoped to a thickness of about 300 nonometers and then is subsequently doped by ion implantation or thermal diffusion after the implantation of the barrier ions.

In a still further embodiment of the invention (not shown) a first layer of lightly doped or undoped polycrystalline silicon is deposited as in FIG. 2. This is followed by the deposition of a thin barrier layer of silicon oxide, silicon nitride, or silicon carbide, such as by a process of low pressure chemical vapor deposition, over the surface of the first polycrystalline silicon. A second, heavily doped layer of polycrystalline silicon is then deposited over the barrier layer, with the two layers of polycrystalline silicon separated by the barrier layer, forming the composite polycrystalline silicon electrode. Similarly, the impurity may be introduced by using low temperature oxidation of nitridation in a conventional furnace or by a rapid thermal process. The low temperature oxidation process is especially useful because the oxidation along the grain boundaries proceeds more rapidly than does the oxidation along the surface of the polycrystalline silicon. As a result, oxidized plugs are formed in the grain boundaries to impede the diffusion of dopant impurities.

Figure 6:
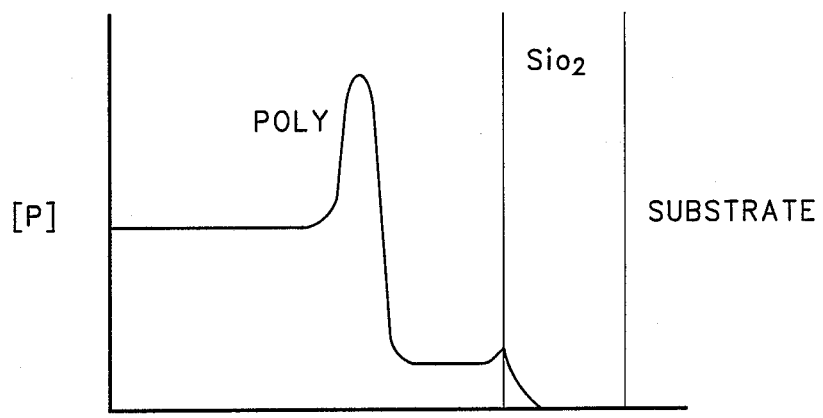
FIG. 6 graphically illustrates the distribution of phosphorus dopant in a polycrystalline silicon electrode formed in accordance with the invention.

FIG. 6 illustrates graphically the effect of practice of the invention on the distribution of phosphorus or other conductivity determining impurity within the polycrystalline silicon electrode. The top most or surface portion of the polycrystalline silicon is characterized by a relatively high and relatively uniform concentration of the dopant impurity. An extremely high concentration of the dopant impurity is found at the intersection between the two polycrystalline silicon layers at the location of the barrier layer. The lower portion of the polycrystalline silicon, adjacent the insulator layer, is relatively lightly doped with a small increase in dopant at the polycrystalline silicon-insulator interface. Only a small portion of the dopant impurity is found within the insulator itself.

The requirement for the barrier layer is, in accordance with the invention, that the barrier forming impurity form a layer which blocks or impedes the diffusion of conductivity determining impurities along the grain boundaries and, at the same time, is of low enough concentration to not appreciably affect the conductivity of the composite gate electrode. The impurities carbon, nitrogen, and oxygen are selected as barrier forming impurities because these elements are characterized as having small atoms which aggregate at the grain boundaries. Although the inventors do not want to be limited by any theory of operation, it is believed that, by some mechanism, these barrier forming impurities impede or getter the conductivity determining dopant impurities so that a significant diffusion of those impurities along the grain boundaries to the insulator-polycrystalline silicon interface is avoided. The barrier layer formed does not totally impede the diffusion of impurities between the first and second parts of the composite polycrystalline silicon gate electrode. And the barrier layer does not form a high integrity insulating layer between the two portions of the electrode. This is evidenced by the fact that the conductivity of the polycrystalline silicon electrode is not substantially changed with or without the presence of the barrier layer. Additonally, the diffusion of impurities through the barrier layer is evidenced by the distribution of impurities in the lower layer of polycrystalline silicon as illustrated in FIG. 6.

Thus it is apparent that thee has been provided, in accordance with the invention, an improved polycrystalline silicon electrode and method for its fabrication which fully meet the objects and advantages set forth above. Although the invention has been described with reference to specific embodiments thereof, it is not intended to limit the invention to these illustrative embodiments. Those skilled in the art will appreciate that variations and modifications can be made without departing from the spirit of the invention. For example, different thicknesses of polycrystalline silicon can be used for the two layers of the electrode and different methods can be used for forming the barrier layer. It is intended that all such variations and modifications which fall with the scope of the appended claims be included within the invention.

What is claimed is:

1. A method for fabricating an insulated gate field effect transistor comprising the steps of:
   providing a semiconductor substrate; forming a gate insulator overlying said substrate;
   depositing a first layer of polycrystalline silicon overlying said gate insulator, said first layer being undoped or relatively lightly doped with conductivity determining dopant impurities;
   implanting ions selected from the group consisting of oxygen, nitrogen, and carbon into the surface of said first layer; and
   depositing a second layer of impurity doped polycrystalline silicon overlying said first layer, said second layer being relatively heavily doped with conductivity determining dopant impurities.

2. The method of claim 1 wherein said step of implanting comprises implanting a quantity of ions sufficient to impede the diffusion of dopant from said second layer through said first layer but insufficient to substantially reduce the conductivity of thegate electrode.

3. The method of claim 1 wherein said step of implanting comprises implanting ions at an energy of less than or equal to about 15 KeV to a dose of about $1 \times 10^{14} - 2 \times 10^{16}$ per square centimeter.

4. The method of claim 3 wherein said step of implanting comprises implanting ions to a dose of about $5 \times 10^{15} - 2 \times 10^{16}$.

5. The method of claim 1 wherein said first layer has a thickness of about 50 nm and said second layer has a thickness of about 250 nm.

6. The method of claim 1 wherein said conductivity determining impurities comprise phosphorus or boron.

7. The method of claim 1 wherein said second layer comprises phosphorus doped polycrystalline silicon.

* * * * *